(12) United States Patent
Honda et al.

(10) Patent No.: US 7,816,032 B2
(45) Date of Patent: Oct. 19, 2010

(54) ENERGY DEVICE AND METHOD FOR PRODUCING THE SAME

(75) Inventors: Kazuyoshi Honda, Takatsuki (JP); Kiichiro Oishi, Kyoto (JP); Yasuhiko Bito, Minamikawachi-gun (JP); Takayuki Nakamoto, Sakai (JP)

(73) Assignee: Panasonic Corporation, Osaka (JP)

( * ) Notice: Subject to any disclaimer, the term of this patent is extended or adjusted under 35 U.S.C. 154(b) by 1359 days.

(21) Appl. No.: 10/982,056

(22) Filed: Nov. 4, 2004

(65) Prior Publication Data

US 2005/0118503 A1    Jun. 2, 2005

(30) Foreign Application Priority Data

Nov. 28, 2003  (JP)  .............................. 2003-399753

(51) Int. Cl.
*H01M 4/58*   (2010.01)

(52) U.S. Cl. .................................... 429/218.1; 429/209

(58) Field of Classification Search ............. 429/218.1, 429/231.95, 209; 29/623.5
See application file for complete search history.

(56) References Cited

U.S. PATENT DOCUMENTS

| | | | |
|---|---|---|---|
| 5,677,083 | A | 10/1997 | Tomiyama |
| 6,828,063 | B2 | 12/2004 | Park et al. |
| 6,890,685 | B2 | 5/2005 | Yamamoto et al. |

| | | | |
|---|---|---|---|
| 2005/0008778 | A1 | 1/2005 | Utsugi et al. |

FOREIGN PATENT DOCUMENTS

| | | |
|---|---|---|
| EP | 1 231 651 | 8/2002 |
| EP | 1 289 045 | 3/2003 |
| JP | 8-78002 | 3/1996 |
| JP | 9-129217 | 5/1997 |
| JP | 9-167618 | 6/1997 |
| JP | 2000-12092 | 1/2000 |
| JP | 2001-210315 | 8/2001 |
| JP | 2002-83594 | 3/2002 |
| JP | 2002-313326 | 10/2002 |
| JP | 2003-17039 | 1/2003 |
| JP | 2003-115294 | 4/2003 |

*Primary Examiner*—Jennifer Michener
*Assistant Examiner*—Monique Wills
(74) *Attorney, Agent, or Firm*—Hamre, Schumann, Mueller & Larson, P.C.

(57) ABSTRACT

A negative active material thin film provided on a collector layer directly or via an underlying layer has a multi-layered configuration including at least two silicon thin films containing silicon as a main component. Because of this, even when the thickness of the negative active material thin film is increased, the increase in thickness of one silicon thin film can be prevented by increasing the number of silicon thin films. Thus, the diameter of silicon particles substantially in an inverse truncated cone shape is not enlarged in the silicon thin film. Accordingly, in an energy device having a thin film mainly containing silicon as a negative active material, even when the thickness of the negative active material layer is increased to obtain a larger capacity, cycle characteristics are not degraded.

4 Claims, 12 Drawing Sheets

ENERGY DEVICE AND METHOD FOR PRODUCING THE SAME

BACKGROUND OF THE INVENTION

1. Field of the Invention

The present invention relates to an energy device and a method for producing the same.

2. Description of the Related Art

A lithium ion secondary battery includes a negative collector, a negative active material, an electrolyte, a separator, a positive active material, and a positive collector as main components. The lithium ion secondary battery plays an important role as an energy source for mobile communication equipment and various kinds of AV equipment. Along with the miniaturization and the enhanced performance of equipment, the miniaturization and the increase in energy density of the lithium ion secondary battery are proceeding. Thus, a great amount of efforts are being put into improving each element constituting the battery.

For example, JP8(1996)-78002A discloses that an energy density can be increased by using, as a positive active material, an amorphous oxide obtained by melting mixed powder of a particular transition metal oxide with heating, followed by rapid cooling.

Furthermore, JP2000-12092A discloses that a battery capacity and a cycle life can be enhanced by using a transition metal oxide containing lithium as a positive active material, using a compound containing silicon atoms as a negative active material, and setting the weight of the positive active material to be larger than that of the negative active material.

Furthermore, JP2002-83594A discloses that an amorphous silicon thin film is used as a negative active material. Due to the use of the amorphous silicon thin film, a larger amount of lithium can be absorbed, compared with the case of using carbon, so that an increase in capacity is expected.

However, in the case where the amorphous silicon thin film is used as a negative material for a lithium ion secondary battery, although the amorphous silicon thin film absorbs a large amount of lithium, the expansion/contraction amount of the amorphous silicon thin film during charging/discharging also is large. Therefore, a problem of maintaining cycle characteristics arises. The amorphous silicon thin film can be formed by a vacuum film-forming process such as sputtering, vapor deposition, or the like. In order to increase the capacity, the amorphous silicon thin film that is a negative active material needs to be thick to some degree in accordance with the thickness of a positive electrode. However, when the thickness of the amorphous silicon thin film is set to be large, although the battery capacity is increased, cycle characteristics tend to be degraded. Thus, it has been difficult to satisfy both a large capacity and cycle characteristics.

SUMMARY OF THE INVENTION

The present invention solves the above-mentioned problem of the prior art, and its object is to provide an energy device including a thin film mainly containing silicon as a negative active material, and satisfying both a large capacity and cycle characteristics, and a method for producing the energy device.

In order to achieve the above-mentioned object, an energy device of the present invention includes a collector layer and a negative active material thin film provided on the collector layer directly or via an underlying layer, wherein the negative active material thin film has a multi-layered configuration including at least two silicon thin films containing silicon as a main component.

Furthermore, a method for producing an energy device of the present invention includes the step of forming a negative active material thin film on a collector layer directly or via an underlying layer by a vacuum film-forming method, wherein the step of forming the negative active material thin film includes at least two silicon deposition steps separated in terms of time.

These and other advantages of the present invention will become apparent to those skilled in the art upon reading and understanding the following detailed description with reference to the accompanying figures.

DESCRIPTION OF THE PREFERRED EMBODIMENTS

Figure 1:
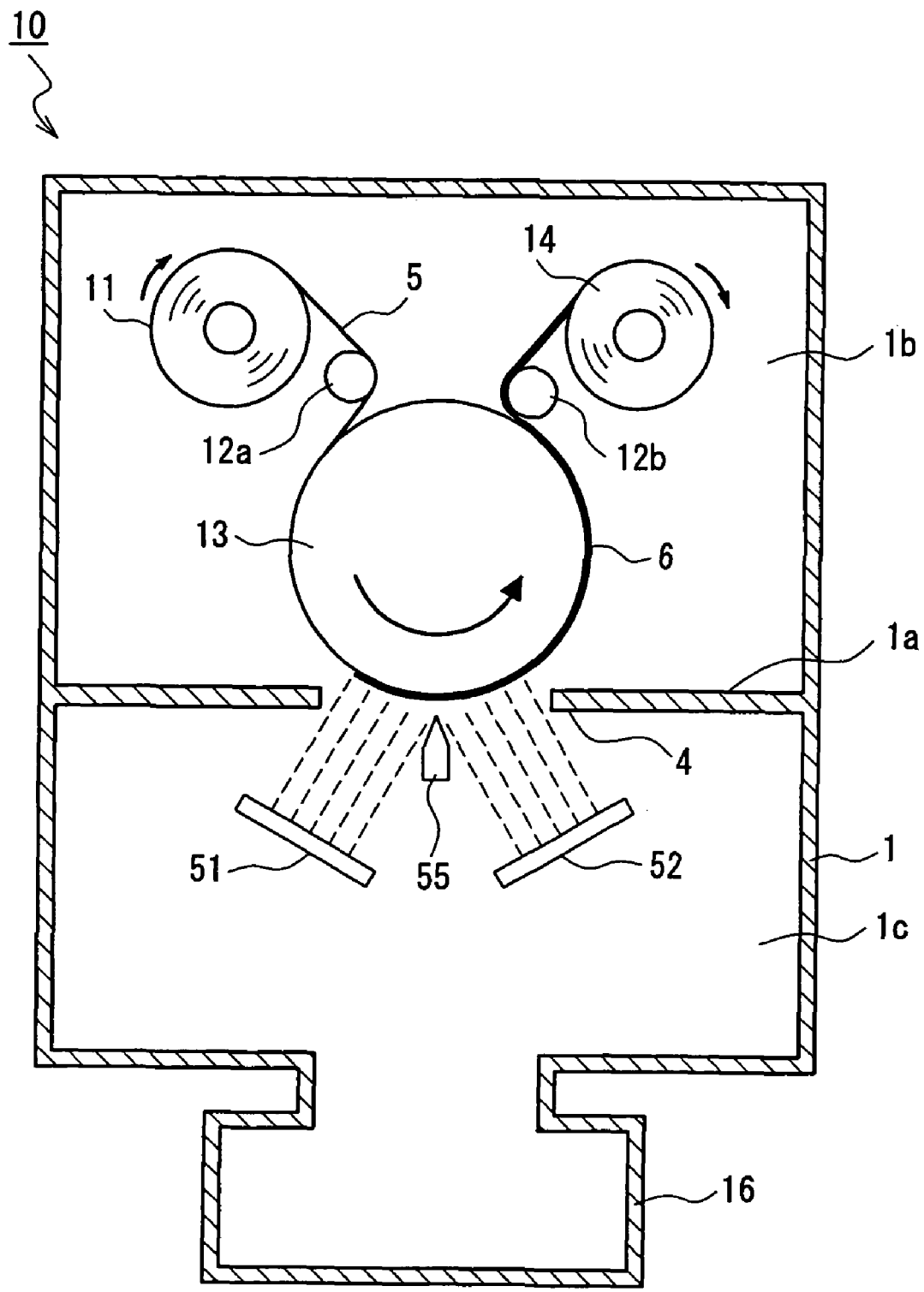
FIG. 1 is a cross-sectional view showing a schematic configuration of one embodiment of an apparatus used for producing an energy device of the present invention.
Figure 2A:
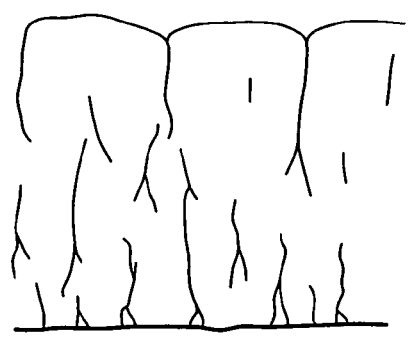
FIGS. 2A to 2D schematically show SEM photographs of cross-sections of negative active material thin films in Comparative Example 1, and Examples 1, 2, and 3, in this order.
Figure 2B:
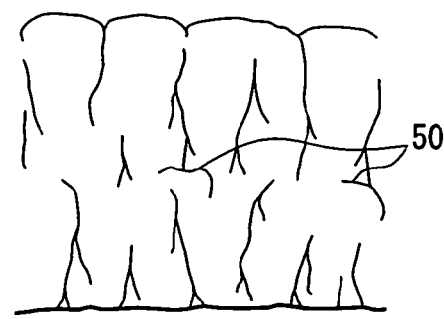
Figure 2C:
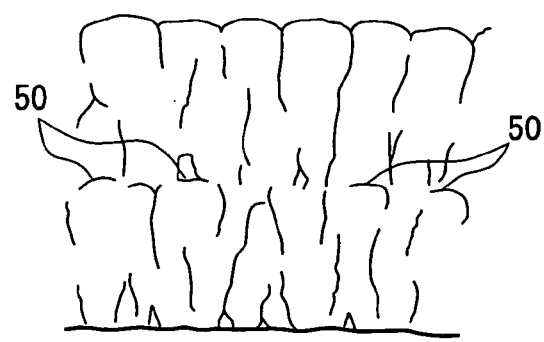
Figure 2D:
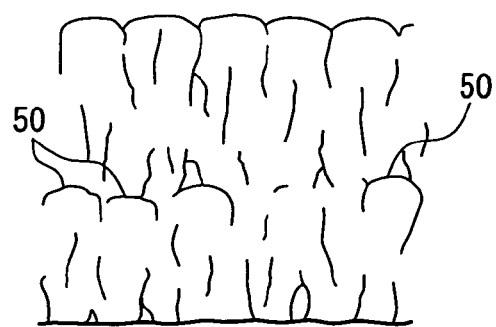

According to the energy device and the method for producing the same of the present invention, even when the thickness of the negative active material layer is increased in accordance with the thickness of the positive active material layer, cycle characteristics can be prevented from being degraded. According to this configuration, an energy device that satisfies both a large capacity and cycle characteristics can be realized.

An energy device of the present invention includes a collector layer and a negative active material thin film provided on the collector layer directly or via an underlying layer. The negative active material thin film has a multi-layered configuration including at least two silicon thin films containing silicon as a main component.

When a silicon thin film is formed by a vacuum film-forming method or the like, silicon generally forms columnar particles substantially in an inverse truncated cone shape with a thickness direction being a central axis direction. When the thickness of the silicon thin film is increased so as to increase a battery capacity, the height of the particles substantially in an inverse truncated cone shape is increased, and consequently, the diameter thereof is enlarged. When charging/discharging is performed using the silicon thin film as a negative active material for a lithium ion secondary battery, lithium ions are absorbed/desorbed repeatedly in the silicon thin film, whereby silicon particles expand/contract repeatedly. When the silicon particles with an enlarged diameter are present in the silicon thin film, the expansion/contraction of the silicon particles causes peeling on an interface between the silicon thin film and the negative collector layer, and strain and breakage of the silicon particles, which degrade cycle characteristics.

According to the present invention, the negative active material thin film has a multi-layered configuration of at least two silicon thin films. Therefore, even when the thickness of the negative active material thin film is increased, the increase in thickness of one silicon thin film can be prevented by increasing the number of silicon thin films. Thus, the silicon particle diameter is not enlarged in the silicon thin film. Accordingly, even when the thickness of the negative active material thin film is increased, cycle characteristics can be prevented from being degraded. Consequently, an energy device, which satisfies both a large capacity and cycle characteristics, can be realized.

According to the present invention, "containing silicon as a main component" means that the content of silicon is 50 at % or more. In order to increase the battery capacity, the content of silicon is desirably 70 at % or more, more desirably 80 at % or more, and most desirably 90 at % or more. This is because, as the content of silicon is higher, the battery capacity can be increased more.

It is preferable that the silicon thin film has columnar particles with a thickness direction being a longitudinal direction, and the columnar particles are discontinuous between the silicon thin films adjacent to each other in a thickness direction. According to this configuration, the generation of silicon particles with an enlarged diameter can be suppressed. Thus, even when the silicon particles expand/contract due to the absorption/desorption of lithium ions involved in the repetition of charging/discharging, the peeling on an interface between the silicon thin film and the negative collector layer, and the strain and breakage of the silicon particles can be suppressed. Consequently, cycle characteristics can be prevented from being degraded.

It is preferable that an interface layer is present between the silicon thin films adjacent to each other. According to this configuration, the columnar particles sandwiching the interface layer can be made discontinuous, so that the generation of silicon particles with an enlarged diameter can be suppressed.

It is preferable that a compound of silicon and a gaseous element is present in the interface layer. According to this configuration, columnar particles sandwiching the interface layer can be made discontinuous more exactly.

It is preferable that the compound is a nitride or an oxide. Such a compound can be formed easily during formation of the silicon thin film, and furthermore, discontinuous columnar particles of silicon can be formed exactly.

Alternatively, an intermediate layer in which the content of silicon is less than 50 at % may be present between the silicon thin films adjacent to each other. According to this configuration, the columnar particles sandwiching the intermediate layer can be made discontinuous, so that the generation of silicon particles with an enlarged diameter can be suppressed.

It is preferable that the intermediate layer contains lithium. According to this configuration, the intermediate layer can complement lithium ions, so that the battery capacity can be increased.

It is preferable that the intermediate layer is a discontinuous film or has an island shape. According to this configuration, ions can move easily, so that cycle characteristics can be enhanced.

It is preferable that the intermediate layer contains an element having a melting point lower than that of silicon. According to this configuration, it becomes easy to form an intermediate layer of a discontinuous film or having an island shape.

It may be preferable that a part of silicon contained in the silicon thin film is an oxide. The oxide of silicon used herein does not include an oxide of silicon contained in the above-mentioned interface layer present between the silicon thin films adjacent to each other in a thickness direction. This means that an oxide of silicon is contained in an intermediate region excluding upper and lower interface layers in a thickness direction. In the case where a content of silicon in the silicon thin film is large, and a battery capacity is large, the degree of expansion/contraction of the silicon thin film during charging/discharging is high, which may degrade cycle characteristics. When the silicon thin film contains an oxide of silicon, since the oxide of silicon expands/contracts less during charging/discharging, the expansion/contraction of the silicon thin film during charging/discharging can be suppressed, and cycle characteristics can be enhanced.

Next, a method for producing an energy device of the present invention is a method for producing an energy device in which a negative active material thin film and a positive active material thin film are opposed to each other via a layer that does not exhibit electronic conduction, including the steps of forming the negative active material thin film on a collector layer directly or via an underlying layer by a vacuum film-forming method, and forming the positive active material thin film. The step of forming the negative active material thin film includes at least two silicon deposition steps separated in terms of time.

By forming a single negative active material thin film by performing the silicon deposition step a plurality of times, separately in terms of time, columnar particles of silicon that are discontinuous in a thickness direction can be formed easily in the single negative active material thin film. Thus, even when the thickness of the negative active material thin film is increased, the increase in size in a thickness direction of silicon particles substantially in an inverse truncated cone shape can be prevented by increasing the number of silicon deposition steps. Accordingly, the silicon particle diameter is not enlarged in the negative active material thin film. Thus, even when the thickness of the negative active material layer is increased, cycle characteristics can be prevented from being degraded. Consequently, an energy device that satisfies both a large capacity and cycle characteristics can be realized.

"Vacuum film-forming method" as used herein includes various kinds of vacuum thin film production processes such as vapor deposition, sputtering, chemical vapor deposition (CVD), ion plating, laser abrasion, and the like. Depending upon the kind of a thin film, an appropriate film-forming method can be selected. A thinner negative active material thin film can be produced more efficiently by a vacuum film-forming method. As a result, a small and thin energy device is obtained.

It is preferable that, between the at least two silicon deposition steps, a surface of a formed silicon thin film containing silicon as a main component is subjected to a surface reforming treatment. Due to the surface reforming treatment, an interface layer that makes silicon columnar particles discontinuous can be formed easily in the negative active material layer. Thus, the generation of silicon particles with an enlarged diameter can be suppressed.

It is preferable that the surface reforming treatment is gas introduction to the surface of the silicon thin film. Such a surface reforming treatment can be performed easily by a vacuum film-forming method.

It is preferable that the gas contains nitrogen or oxygen as a main component. According to this configuration, silicon particles formed before and after the surface reforming treatment can be made discontinuous easily by a simple method.

It is preferable that the gas is ionized or formed into plasma. According to this configuration, silicon particles formed before and after the surface reforming treatment can be made discontinuous more exactly.

Alternatively, an intermediate layer in which a content of silicon is less than 50 at % may be formed between the at least two silicon deposition steps. According to this configuration, columnar particles in the silicon thin film, formed before and after the formation of the intermediate layer, can be made discontinuous, so that the generation of silicon particles with an enlarged diameter can be suppressed.

It is preferable that the intermediate layer is formed in a vacuum atmosphere by a vacuum film-forming method, continuously from the silicon deposition step. By performing the silicon deposition step and the intermediate layer formation step without destroying a vacuum atmosphere, the interlayer adhesion is enhanced to prevent peeling, so that the battery capacity can be prevented from being decreased. Furthermore, by performing both the steps by a vacuum film-forming method, a negative active material thin film can be formed efficiently.

It is preferable that the intermediate layer is formed in a vacuum atmosphere by a vacuum film-forming method, followed by the silicon deposition step. By performing the intermediate layer formation step and the silicon deposition step without destroying a vacuum atmosphere, the interlayer adhesion is enhanced to prevent peeling, so that the battery capacity can be prevented from being decreased. Furthermore, by performing both the steps by a vacuum film-forming method, a negative active material thin film can be formed efficiently.

It is preferable that the intermediate layer contains an element having a melting point lower than that of silicon. According to this configuration, by heating during or after film formation, an intermediate layer of a discontinuous film or having an island shape can be formed easily. By forming such an intermediate layer, ions can move easily, which can enhance cycle characteristics.

It is preferable that, assuming that a melting point of a material for forming the intermediate layer is Tm (° C.), a temperature of a film-formation surface during formation of the intermediate layer is maintained at Tm/3 (° C.) or higher. According to this configuration, an intermediate layer of a discontinuous film or having an island shape can be formed efficiently.

Alternatively, after the intermediate layer is formed, the intermediate layer may be heated to a temperature equal to or higher than a melting point thereof. According to this configuration, an intermediate layer of a discontinuous film or having an island shape also can be formed easily.

It is preferable that the silicon deposition step is performed in an atmosphere of inert gas or nitrogen. According to this configuration, silicon columnar particles adjacent to each other in a direction parallel to a deposition surface can be prevented from being integrated and growing to enlarge a silicon particle diameter. Consequently, the cycle characteristics can be suppressed from being degraded due to the extreme expansion/contraction of silicon particles during charging/discharging. As the atmospheric gas, argon is most preferable in terms of practicability and conspicuousness of the above-mentioned effects.

Hereinafter, embodiments of the present invention will be described with reference to the drawings.

Embodiment 1

An energy device according to Embodiment 1 of the present invention will be described.

The energy device of Embodiment 1 has the following configuration. A cylindrical winding body, in which a positive collector with a positive active material formed on both surfaces thereof, a separator as a layer that does not exhibit electronic conduction, and a negative collector with a negative active material formed on both surfaces thereof are wound so that the separator is placed between the positive collector and the negative collector, is placed in a battery can, and the battery can is filled with an electrolyte solution.

As the positive collector, a foil, a net, or the like (thickness: 10 to 80 µm) made of Al, Cu, Ni, or stainless steel can be used. Alternatively, a polymer substrate made of polyethylene terephthalate, polyethylene naphthalate, or the like with a metal thin film formed thereon also can be used.

The positive active material is required to allow lithium ions to enter therein or exit therefrom, and can be made of a lithium-containing transition metal oxide containing transition metal such as Co, Ni, Mo, Ti, Mn, V, or the like, or a mixed paste in which the lithium-containing transition metal oxide is mixed with a conductive aid such as acetylene black and a binder such as nitrile rubber, butyl rubber, polytetrafluoroethylene, polyvinylidene fluoride, or the like.

As the negative collector, a foil, a net, or the like (thickness: 10 to 80 µm) made of Cu, Ni, or stainless steel can be used. Alternatively, a polymer substrate made of polyethylene terephthalate, polyethylene naphthalate, or the like with a metal thin film formed thereon also can be used.

The separator preferably has excellent mechanical strength and ionic permeability, and can be made of polyethylene, polypropylene, polyvinylidene fluoride, or the like. The pore diameter of the separator is, for example, 0.01 to 10 µm, and the thickness thereof is, for example, 5 to 200 µm.

As the electrolyte solution, a solution, which is obtained by dissolving an electrolyte salt such as $LiPF_6$, $LiBF_4$, $LiClO_4$, or the like in a solvent such as ethylene carbonate, propylene carbonate, methyl ethyl carbonate, methyl acetate hexafluoride, tetrahydrofuran, or the like, can be used.

As the battery can, although a metal material such as stainless steel, iron, aluminum, nickel-plated steel, or the like can be used, a plastic material also can be used depending upon the use of a battery.

The negative active material is a silicon thin film containing silicon as a main component. The silicon thin film preferably is amorphous or microcrystalline, and can be formed by a vacuum film-forming method such as sputtering, vapor deposition, or CVD.

Examples 1-3 and Comparative Example 1

Examples corresponding to Embodiment 1 will be described.

First, a method for producing a positive electrode will be described. $Li_2CO_3$ and $CoCO_3$ were mixed in a predetermined molar ratio, and synthesized by heating at 900° C. in the air, whereby $LiCoO_2$ was obtained. $LiCoO_2$ was classified to 100-mesh or less to obtain a positive active material. Then, 100 g of the positive active material, 10 g of carbon powder as a conductive agent, 8 g of polyethylene tetrafluoride dispersion as a binder, and pure water were mixed to obtain a paste. The paste containing the positive active material was applied to both surfaces of a band-shaped aluminum foil (thickness: 15 μm) as a positive collector, followed by drying, whereby a positive electrode was obtained.

Using a band-shaped copper foil (thickness: 30 μm) as a negative collector, a silicon thin film was formed as a negative active material on both surfaces of the copper foil by sputtering. This will be described in detail later.

As a separator, band-shaped porous polyethylene (thickness: 25 μm) with a width larger than those of the positive collector and the negative collector was used.

A positive lead made of the same material as that of the positive collector was attached to the positive collector by spot welding. Furthermore, a negative lead made of the same material as that of the negative collector was attached to the negative collector by spot welding.

The positive electrode, the negative electrode, and the separator obtained as described above were laminated so that the separator was placed between the positive electrode and the negative electrode, and wound in a spiral shape. An insulating plate made of polypropylene was provided at upper and lower surfaces of the cylindrical winding body thus obtained, and the resultant cylindrical winding body was placed in a bottomed cylindrical battery can. A stepped portion was formed in the vicinity of an opening of the battery can. Thereafter, as a non-aqueous electrolyte solution, an isosteric mixed solution of ethylene carbonate and diethyl carbonate in which $LiPF_6$ was dissolved in a concentration of $1 \times 10^3$ mol/$m^3$, was injected into the battery can, and the opening was sealed with a sealing plate to obtain a lithium ion secondary battery.

A method for forming a silicon thin film as the negative active material will be described with reference to FIG. 1.

A vacuum film-forming apparatus 10 shown in FIG. 1 includes a vacuum tank 1 partitioned into an upper portion and a lower portion by a partition wall 1a. In a chamber (transportation chamber) 1b on an upper side of the partition wall 1a, an unwinding roll 11, a cylindrical can roll 13, a take-up roll 14, and transportation rolls 12a, 12b are provided. In a chamber (thin film forming chamber) 1c on a lower side of the partition wall 1a, a first sputtering film-forming source 51, a gas introduction nozzle 55, and a second sputtering film-forming source 52 are provided. At a center of the partition wall 1a, a mask 4 is provided, and a lower surface of the can roll 13 is exposed to the thin film forming chamber 1c side via the opening of the mask 4. The inside of the vacuum tank 1 is maintained at a predetermined vacuum degree by a vacuum pump 16.

A band-shaped negative collector 5 unwound from the unwinding roll 11 is transported successively by the transportation roll 12a, the can roll 13, and the transportation roll 12b, and taken up around the take-up roll 14. During this process, particles (hereinafter, referred to as "sputtering particles") such as atoms, molecules, or a cluster generated from the first sputtering film-forming source 51 and the second sputtering film-forming source 52 pass through the mask 4 of the partition wall 1a, and adhere to the surface of the negative collector 5 running on the can roll 13, thereby forming a thin film 6. The first sputtering film-forming source 51, the gas introduction nozzle 55, and the second sputtering film-forming source 52 are placed so as to oppose the negative collector 5 from an upstream side to a downstream side in the transportation direction of the negative collector 5. The gas introduction nozzle 55 extends across an entire width in a width direction (in a direction vertical to the drawing surface of FIG. 1) of the negative collector 5 in the vicinity of the can roll 13. Thus, the gas introduction nozzle 55 functions as a second mask, and prevents the sputtering particles from being deposited on a region of an outer surface of the can roll 13, opposed to the gas introduction nozzle 55. Accordingly, first, the sputtering particles from the first sputtering film-forming source 51 mainly are deposited on the surface of the negative collector 5, and after a short period of time, the sputtering particles from the second sputtering film-forming source 52 mainly are deposited on the negative collector 5.

In Example 1, using the above-mentioned apparatus, silicon was sputtered with argon ions in each of the first sputtering film-forming source 51 and the second sputtering film-forming source 52, whereby a silicon thin film (thickness: 8 μm) was formed on a copper foil as the negative collector 5. The deposition rate of the silicon thin film was set to be about 2 nm/s. As sputtering sources of the first sputtering film-forming source 51 and the second sputtering film-forming source 52, a DC magnetron sputter source was used. Gas was not introduced by the gas introduction nozzle 55 during film formation.

In Example 2, a silicon thin film was formed in the same way as in Example 1, except that $N_2$ gas was introduced at 0.05 Pa·$m^3$/s from the gas introduction nozzle 55 during film formation.

In Example 3, a silicon thin film was formed in the same way as in Example 1, except that $O_2$ gas was introduced at 0.05 Pa·$m^3$/s from the gas introduction nozzle 55 during film formation.

In Comparative Example 1, a silicon thin film (thickness: 8 μm) was formed in the same way as in Example 1, except that only the first sputtering film-forming source 51 was used, with the second sputtering film-forming source 52 and the gas introduction nozzle 55 being removed, and the running speed of the negative collector 5 was adjusted so that the deposition rate was the same as that of Example 1.

FIGS. 2A to 2D schematically show SEM photographs of cross-sections in a thickness direction of the silicon thin films (negative active material thin films) in Comparative Example 1, and Examples 1, 2, and 3 in this order. In each figure, the lower side of the drawing surface corresponds to the negative collector (copper foil) 5 side, and the upper side thereof corresponds to the surface of the silicon thin film.

In Comparative Example 1 (FIG. 2A), silicon particles grow as columnar particles substantially in an inverse truncated cone shape with the particle diameter being increased gradually from an interface between the silicon thin film and the negative collector, and the particle diameter is largest in the vicinity of the surface of the silicon thin film.

In contrast, in Examples 1 to 3 (shown in FIGS. 2B to 2D in this order), although silicon particles similarly grow as columnar particles substantially in an inverse truncated cone shape, the growth of the silicon particles is discontinuous at a center portion in a thickness direction. The discontinuity of the growth of particles is more conspicuous in Examples 2 and 3 (shown in FIGS. 2C and 2D) in which gas is introduced. The positions in the thickness direction of portions where the silicon particles are discontinuous are substantially matched with each other in any of the silicon particles. In Examples 1 to 3 the silicon thin film is divided by an interface layer 50 that corresponds to the discontinuous portion, and has a two-layered configuration in a vertical direction. A layer on a lower side (copper foil side) of the interface layer 50 is considered mainly as a silicon thin film formed by the first sputtering film-forming source 51, and a layer on an upper side of the interface layer 50 is considered mainly as a silicon thin film formed by the second sputtering film-forming source 52. The silicon particles in the layer on the upper side of the interface layer 50 newly start growing substantially in an inverse truncated cone shape from the interface layer 50. Therefore, the particle diameter in the vicinity of the surface of the silicon thin film is smaller than that of Comparative Example 1. In the respective silicon thin films of Examples 1 to 3 and Comparative Example 1, a conspicuous peak corresponding to silicon crystal was not detected by X-ray diffraction measurement ($CuK_\alpha$, 40 kV), whereby these silicon thin films were assumed to be amorphous or microcrystalline.

Figure 3:
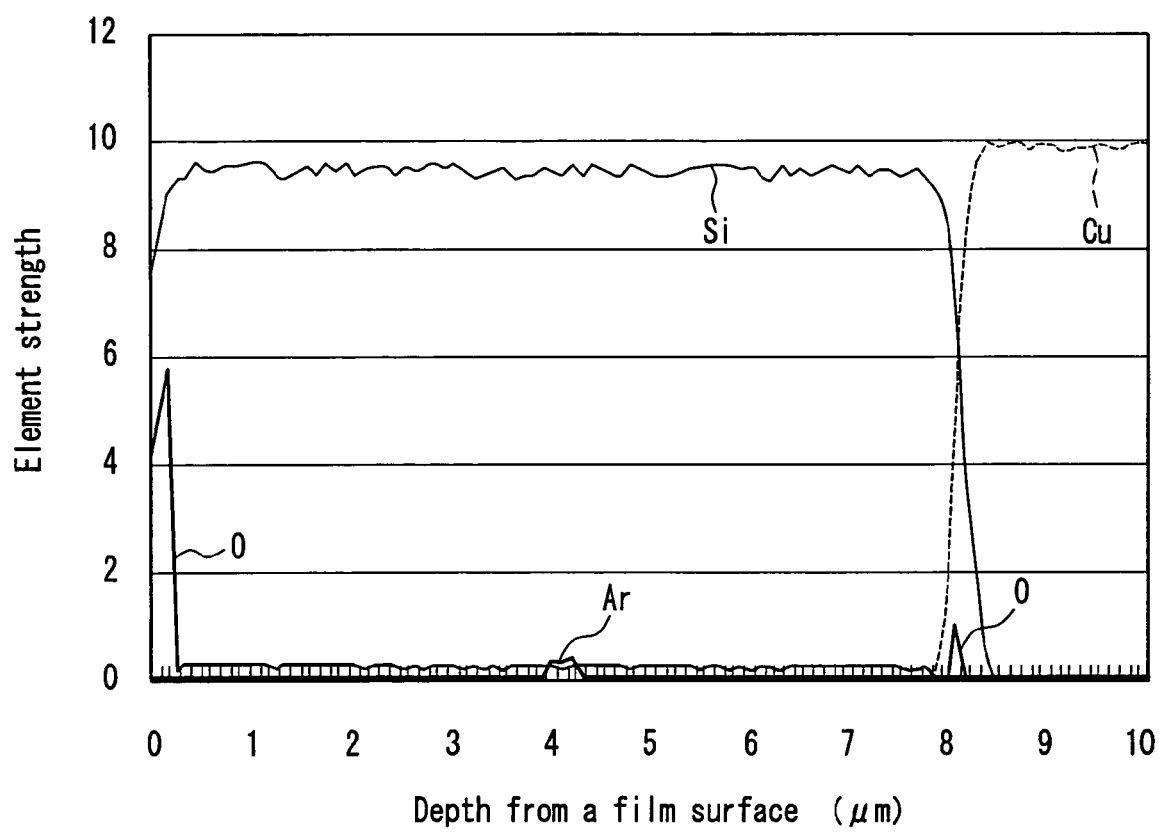
FIG. 3 is an element distribution diagram in a thickness direction of the negative active material thin film of Example 1 of the present invention.

FIG. 3 shows an Auger depth profile of the silicon thin film (negative active material thin film) of Example 1. The Auger depth profile was measured with SAM 670 produced by Philips Co., Ltd. The Auger depth profile was measured at an acceleration voltage of an electron gun of 10 kV, an irradiation current of 10 nA, an acceleration voltage of an ion gun for etching of 3 kV, and a sputtering rate of 0.4 nm/s. "Depth from a film surface" represented by the horizontal axis in FIG. 3 was obtained by converting the sputter etching time of a sample into an etching depth in a thickness direction, using a sputtering rate obtained by measuring the level difference formed by sputter-etching the same Si film and Cu film as those of the sample with a level difference measuring apparatus. As is understood from FIG. 3, in Example 1 in which gas was not introduced during film formation, a slight peak of argon was detected at a position corresponding to the interface layer, and no conspicuous discontinuity of a composition was recognized. The fact that the discontinuity of the growth of particles is recognized in FIG. 2B suggests the following: the growth of silicon particles may become discontinuous even by the slight adhesion of gas to such a degree that cannot be detected or can be detected only in a trace amount with the Auger depth profile.

Figure 4:
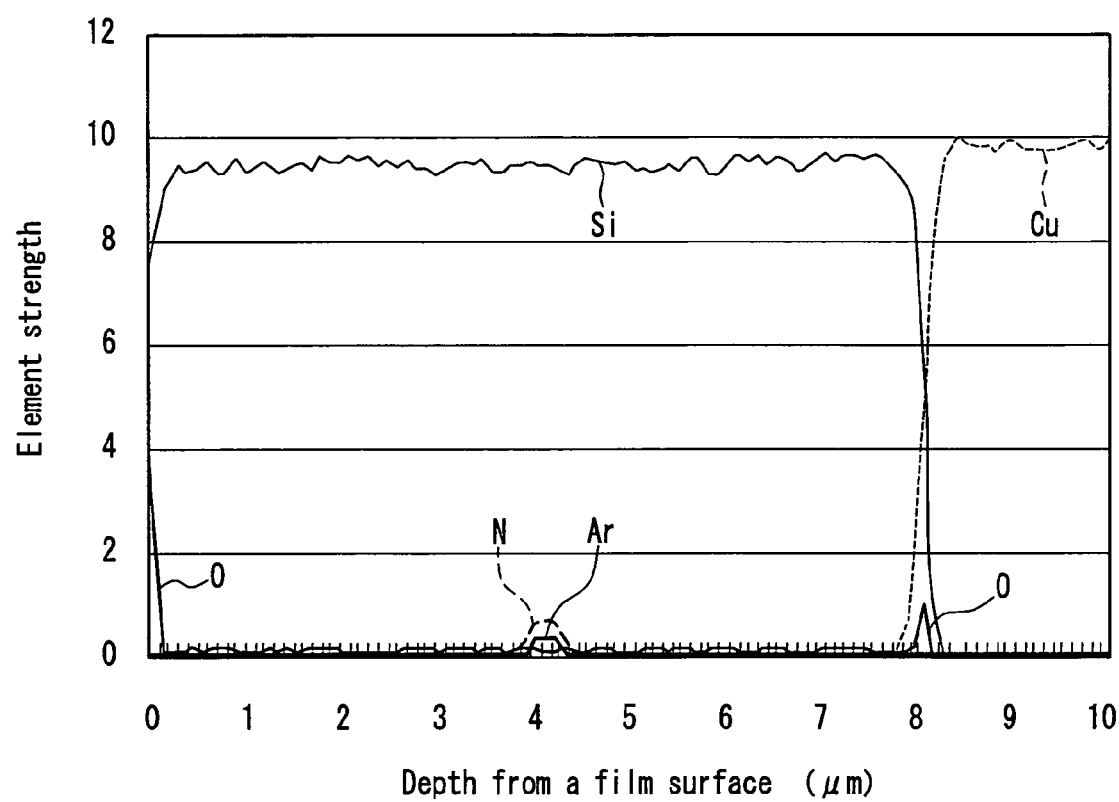
FIG. 4 is an element distribution diagram in a thickness direction of the negative active material thin film of Example 2 of the present invention.

FIG. 4 is a view showing an Auger depth profile of the silicon thin film (negative active material thin film) of Example 2. As is understood from FIG. 4, in Example 2 in which the silicon thin film is exposed to the $N_2$ gas atmosphere between the film formation by the first sputtering film-forming source 51 and the film formation by the second sputtering film-forming source 52, a peak of a nitrogen distribution is detected at a position corresponding to the interface layer. That is, a nitride of silicon is present in the interface layer. Example 2 suggests that, when a nitride of silicon is formed during formation of the silicon thin film, the possibility that the growth of silicon particles becomes discontinuous is increased.

Although not shown, a peak of the oxygen distribution was detected at a position corresponding to the interface layer in the same way as in FIG. 4, even in the silicon thin film (negative active material thin film) of Example 3 exposed to the $O_2$ gas atmosphere between the film formation by the first sputtering film-forming source 51 and the film formation by the second sputtering film-forming source 52. That is, an oxide of silicon was present in the interface layer. It was understood from Example 3 that, even when an oxide of silicon is formed during formation of the silicon thin film, the possibility that the growth of silicon particles becomes discontinuous is increased.

The lithium ion secondary batteries formed in Examples 1 to 3 and Comparative Example 1 were subjected to a charging/discharging cycle test at a test temperature of 20° C., a charging/discharging current of 3 $mA/cm^2$, and a charging/discharging voltage range of 4.2 V to 2.5 V. The ratios of the discharging capacity after 50 cycles and 200 cycles, with respect to the initial discharging capacity, were obtained as battery capacity maintenance ratios (cycle characteristics). Table 1 shows the results.

TABLE 1

|  | Example 1 | Example 2 | Example 3 | Comparative Example 1 |
| --- | --- | --- | --- | --- |
| After 50 cycles | 96% | 98% | 98% | 82% |
| After 200 cycles | 82% | 86% | 87% | 60% |

As is understood from Table 1, in Examples 1 to 3 in which the growth of silicon particles is discontinuous on the interface layer substantially at a center in a thickness direction, the battery capacity maintenance ratios after 50 cycles and 200 cycles are higher than those in Comparative Example 1 in which the interface layer is not present, and the growth of silicon particles is continuous in an entire range in a thickness direction. Furthermore, as a result of the introduction of gas between the film formation by the first sputtering film-forming source 51 and the film formation by the second sputtering film-forming source 52, Examples 2 and 3 in which the discontinuity of the growth of silicon particles is recognized more conspicuously have more satisfactory battery capacity maintenance ratios, compared with Example 1 in which gas is not introduced.

The reason why the battery capacity maintenance ratio (cycle characteristics) is increased by the discontinuity of silicon particles is considered as follows. As described above, in the silicon thin film formed by a vacuum film-forming method, silicon forms columnar particles substantially in an inverse truncated cone shape with a thickness direction being a central axis direction. When the silicon thin film is used as the negative active material for a lithium ion secondary battery, absorption/desorption of lithium ions is repeated due to charging/discharging, and silicon particles expand/contract repeatedly. This causes peeling at the interface between the silicon thin film and the negative collector layer, and strain and breakage of the silicon particles, thereby decreasing a battery capacity maintenance ratio (cycle characteristics). The reason why the cycle characteristics are decreased, when the thickness of the silicon thin film is increased so as to increase a battery capacity, is considered as follows: silicon particles grow in accordance with the increase in thickness, and the largest diameter thereof also is increased, so that the interference among the silicon particles is increased. When the interface layer that makes the growth of silicon particles discontinuous is formed in the silicon thin film as in Examples 1 to 3, the silicon particles newly start growing from the interface layer. Thus, an increase in the largest diameter of the silicon particles is suppressed, and the interference among the silicon particles is suppressed. Therefore, a satisfactory battery capacity maintenance ratio (cycle characteristics) is obtained.

As described above, by forming an interface layer, which makes the columnar particle shape of silicon discontinuous, in the silicon thin film, a multi-layered silicon thin film including at least two silicon thin films containing silicon as a main component can be obtained. In the case where such a multi-layered silicon thin film is used as the negative active material layer for the lithium ion secondary battery, cycle characteristics are not degraded even when the entire thickness of the negative active material layer is increased. Thus, an energy device that satisfies both an increase in a battery capacity and cycle characteristics can be provided.

By ionizing gas introduced by the gas introduction nozzle 55, or forming it into plasma, the reactivity between the introduced gas and the thin film particles is increased, and the effect of gas introduction can be enhanced. Ionization of the introduced gas can be realized by additionally providing functions of an ion source or a plasma source to the gas introduction nozzle 55. As the ion source, various types such as a hot cathode type, a hollow cathode type, and the like can be used, and there is no particular limit to the type. At a time of introducing oxygen gas, it is preferable, for example, to use mixed gas of oxygen gas and inert gas, so as not to degrade a hot cathode by oxidation, and the like. An applied voltage for generating plasma may be any of a DC voltage, an AC voltage, and a high-frequency voltage. Even in the case where the introduced gas was ionized or formed into plasma, the same effects as those in Examples 2 and 3 were obtained in the cross-sectional SEM shape, the Auger depth profile, and the battery capacity maintenance ratio (cycle characteristics), whereas the capacity maintenance ratio after 200 cycles was enhanced by about 2% compared with Examples 2 and 3. The reason for this is considered as follows: when the introduced gas is ionized or formed into plasma, the reactivity between the introduced gas and the thin film particles is increased, whereby the effect of gas introduction on making the growth of silicon particles discontinuous is enhanced.

Examples 4 and 5, and Comparative Example 2

Other examples corresponding to Embodiment 1 will be described.

First, a method for producing a positive electrode will be described. $Li_2CO_3$ and $CoCO_3$ were mixed in a predetermined molar ratio, and synthesized by heating at 900° C. in the atmosphere, whereby $LiCoO_2$ was obtained. $LiCoO_2$ was classified to 100-mesh or less to obtain a positive active material. Then, 100 g of the positive active material, 12 g of carbon powder as a conductive agent, 10 g of polyethylene tetrafluoride dispersion as a binder, and pure water were mixed to obtain a paste. The paste containing the positive active material was applied to both surfaces of a band-shaped aluminum foil (thickness: 25 μm) as a positive collector, followed by drying, whereby a positive electrode was obtained.

Using a band-shaped copper foil (thickness: 20 μm) as a negative collector, a silicon thin film was formed as a negative active material on both surfaces of the negative collector by vacuum vapor deposition. This will be described in detail later.

As the separator, band-shaped porous polyethylene (thickness: 35 μm) with a width larger than those of the positive collector and the negative collector was used.

A positive lead made of the same material as that of the positive collector was attached to the positive collector by spot welding. Furthermore, a negative lead made of the same material as that of the negative collector was attached to the negative collector by spot welding.

The positive electrode, the negative electrode, and the separator obtained as described above were laminated so that the separator was placed between the positive electrode and the negative electrode, and wound in a spiral shape. An insulating plate made of polypropylene was provided at upper and lower surfaces of the cylindrical winding body thus obtained, and the resultant cylindrical winding body was placed in a bottomed cylindrical battery can. A stepped portion was formed in the vicinity of an opening of the battery can. Thereafter, as a non-aqueous electrolyte solution, an isosteric mixed solution of ethylene carbonate and diethyl carbonate, in which $LiPF_6$ was dissolved in a concentration of $1\times10^3$ mol/m$^3$, was injected into the battery can, and the opening was sealed with a sealing plate to obtain a lithium ion secondary battery.

A method for forming a silicon thin film as the negative active material will be described with reference to FIG. 5.

Figure 5:
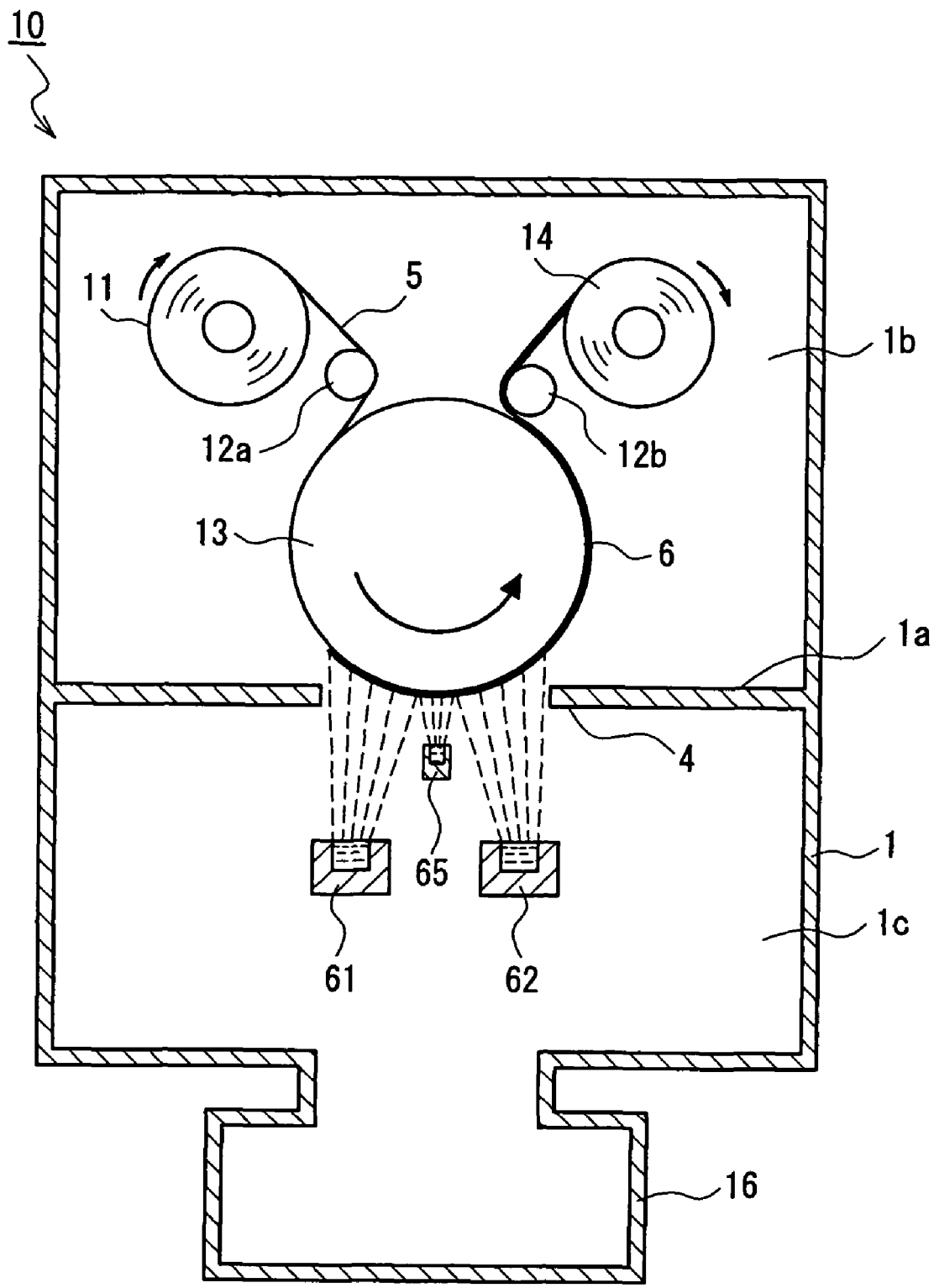
FIG. 5 is a cross-sectional view showing a schematic configuration of another embodiment of an apparatus used for producing the energy device of the present invention.

An apparatus shown in FIG. 5 is different from that shown in FIG. 1 in that a first vapor deposition source 61, an intermediate layer vapor deposition source 65, and a second vapor deposition source 62 are placed in the thin film forming chamber 1c, in place of the first sputtering film-forming source 51, the gas introduction nozzle 55, and the second sputtering film-forming source 52. In FIG. 5, the same components as those in FIG. 1 are denoted with the same reference numerals as those therein, and the description thereof will be omitted.

The band-shaped negative collector 5 unwound from the unwinding roll 11 is transported successively by the transportation roll 12a, the can roll 13, and the transportation roll 12b, and taken up around the take-up roll 14. During this process, particles (hereinafter, referred to as "evaporated particles") such as atoms, molecules, or a cluster generated from the first vapor deposition source 61, the intermediate layer vapor deposition source 65, and the second vapor deposition source 62 pass through the mask 4 of the partition wall 1a, and adhere to the surface of the negative collector 5 running on the can roll 13, thereby forming the thin film 6. The first vapor deposition source 61, the intermediate layer vapor deposition source 65, and the second vapor deposition source 62 are placed so as to oppose the negative collector 5 from an upstream side to a downstream side in the transportation direction of the negative collector 5. The intermediate layer vapor deposition source 65 extends across the entire width in a width direction (in a direction vertical to the drawing surface of FIG. 5) of the negative collector 5 in the vicinity of the can roll 13. Thus, the intermediate layer vapor deposition source 65 functions as a second mask, and prevents the evaporated particles from the first vapor deposition source 61 and the second vapor deposition source 62, from being deposited on a region of an outer surface of the can roll 13, opposed to the intermediate layer vapor deposition source 65. Thus, first, the evaporated particles from the first vapor deposition source 61 mainly are deposited on the surface of the negative collector 5; then, the evaporated particles from the intermediate layer vapor deposition source 65 mainly are deposited thereon; and finally, the evaporated particles from the second vapor deposition source 62 mainly are deposited thereon.

In Examples 4 and 5, using the above-mentioned apparatus, silicon was deposited by electron beam vapor deposition from the first vapor deposition source 61 and the second vapor deposition source 62, whereby a silicon thin film (thickness: 6 µm) was formed on a copper foil as the negative collector 5. The deposition rate of the silicon thin film was set to be about 0.1 µm/s. As the first vapor deposition source 61 and the second vapor deposition source 62, a 270° deflection type electron beam vapor deposition source was used.

Furthermore, in Example 4, aluminum was vapor-deposited from the intermediate layer vapor deposition source 65. The deposition amount of aluminum was set to be the same as that for vapor-depositing only aluminum to form a thin film having a thickness of 0.1 µm.

Furthermore, in Example 5, lithium was vapor-deposited from the intermediate layer vapor deposition source 65. The deposition amount of lithium was set to be the same as that for vapor-depositing only lithium to form a thin film having a thickness of 0.1 µm.

In Comparative Example 2, a silicon thin film (thickness: 6 µm) was formed in the same way as in Examples 4 and 5, except that only the first vapor deposition source 61 was used, with the second vapor deposition source 62 and the intermediate layer vapor deposition source 65 being removed, and the running speed of the negative collector 5 was adjusted so that the deposition rate was the same as those of Examples 4 and 5.

Figure 6A:
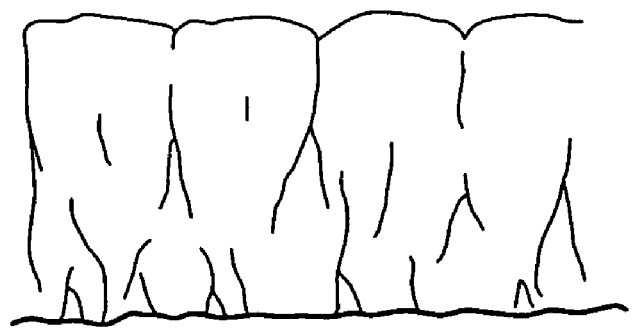
FIGS. 6A to 6C schematically show SEM photographs of cross-sections of negative active material thin films in Comparative Example 2, and Examples 4 and 5, in this order.
Figure 6B:
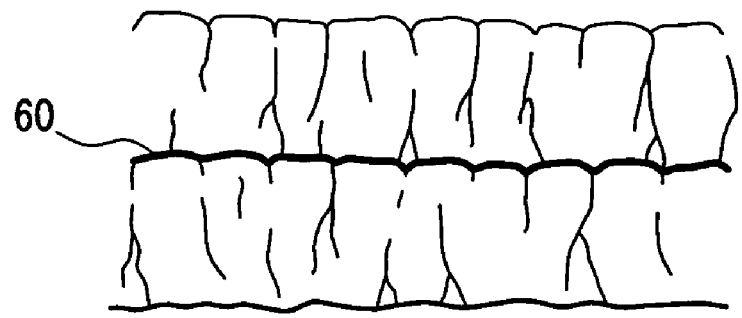
Figure 6C:
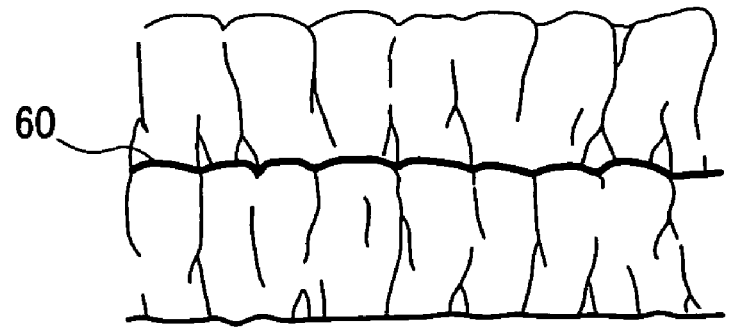

FIGS. 6A to 6C schematically show SEM photographs of cross-sections in a thickness direction of the silicon thin films (negative active material thin films) in Comparative Example 2, and Examples 4 and 5 in this order. In each figure, the lower side of the drawing surface corresponds to the negative collector (copper foil) 5 side, and the upper side thereof corresponds to the surface of the silicon thin film.

In Comparative Example 2 (FIG. 6A), silicon particles grow as columnar particles substantially in an inverse truncated cone shape with the particle diameter being increased gradually from an interface between the silicon thin film and the negative collector, and the particle diameter is largest in the vicinity of the surface of the negative active material.

In contrast, in Examples 4 and 5 (shown in FIGS. 6B and 6C in this order), although silicon particles similarly grow as columnar particles substantially in an inverse truncated cone shape, the growth of the silicon particles is discontinuous on both sides of a layer (intermediate layer) 60 having a slight thickness present at a center portion in a thickness direction. The silicon thin film is divided by the intermediate layer 60, and has a two-layered configuration in a vertical direction. A layer on a lower side (copper foil side) from the intermediate layer 60 is considered mainly as a silicon thin film formed by the first vapor deposition source 61, the intermediate layer 60 is considered mainly as an aluminum thin film (Example 4) or a lithium thin film (Example 5) formed by the intermediate layer vapor deposition source 65, and a layer on an upper side of the intermediate layer 60 is considered mainly as the silicon thin film formed by the second vapor deposition source 62. The silicon particles in the layer on the upper side of the intermediate layer 60 newly start growing substantially in an inverse truncated cone shape from the intermediate layer 60. Therefore, the particle diameter in the vicinity of the surface of the silicon thin film is smaller than that of Comparative Example 2. In the respective silicon thin films of Examples 4 and 5 and Comparative Example 2, a conspicuous peak corresponding to silicon crystal was not detected by X-ray diffraction measurement (CuK$_\alpha$, 40 kV), whereby these silicon thin films were assumed to be amorphous or microcrystalline.

Figure 7:
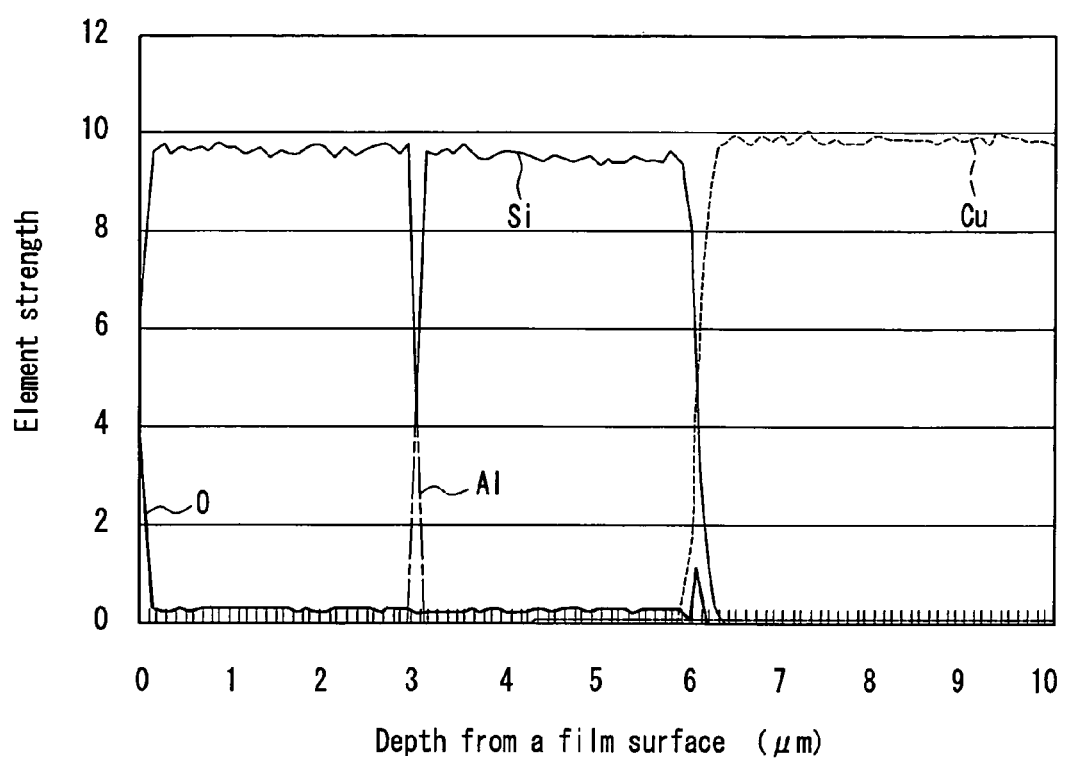
FIG. 7 is an element distribution diagram in a thickness direction of the negative active material thin film of Example 4 of the present invention.

FIG. 7 shows an Auger depth profile of the silicon thin film (negative active material thin film) of Example 4. As is understood from FIG. 7, in Example 4 in which an aluminum film is formed during formation of the silicon thin film, a conspicuous peak of aluminum is detected at a position corresponding to the intermediate layer. Example 4 suggests that, when the aluminum thin film is formed during formation of the silicon thin film, the possibility that the growth of silicon particles becomes discontinuous is increased.

Although not shown, a peak of lithium was detected at a position corresponding to the intermediate layer in the same way as in FIG. 7, even in Example 5 in which a lithium film was formed during formation of the silicon thin film (negative active material thin film). It was understood from Example 5 that, even when the lithium thin film is formed during formation of the silicon thin film, the possibility that the growth of silicon particles becomes discontinuous is increased.

When the Auger depth profile in Example 4 was compared with that in Example 5, a peak distribution was more gentle for lithium of Example 5 than for aluminum in Example 4. The reason for this is considered as follows: lithium atoms are smaller and lighter than aluminum atoms, so that the lithium atoms are more likely to disperse and move during or after film formation.

The lithium ion secondary batteries formed in Examples 4 and 5 and Comparative Example 2 were subjected to a charging/discharging cycle test at a test temperature of 20° C., a charging/discharging current of 7.5 mA/cm$^2$, and a charging/discharging voltage range of 4.2 V to 2.5 V. The ratios of the capacity after 50 cycles and 200 cycles, with respect to the initial discharging capacity, were obtained as battery capacity maintenance ratios (cycle characteristics). Table 2 shows the results.

TABLE 2

|  | Example 4 | Example 5 | Comparative Example 2 |
| --- | --- | --- | --- |
| After 50 cycles | 96% | 97% | 76% |
| After 200 cycles | 82% | 83% | 58% |

As is understood from Table 2, in Examples 4 and 5 in which the growth of silicon particles is discontinuous on an intermediate layer substantially at a center in a thickness direction, the battery capacity maintenance ratios after 50 cycles and 200 cycles are higher than those in Comparative Example 2 in which the intermediate layer is not present, and the growth of silicon particles is continuous in an entire range in a thickness direction.

Furthermore, when the initial discharging capacities were compared, that of Example 4 was substantially equal to that of Comparative Example 2, whereas that of Example 5 was higher by about 5% than that of Example 4. The reason for this is assumed as follows: a part of lithium constituting the intermediate layer played a role of complementing a portion of the lithium ions that became unable to move freely in the silicon thin film for some reason after the initial charging.

Thus, by forming the intermediate layer that makes the columnar particle shape of silicon discontinuous in the silicon thinfilm, a multi-layered silicon thin film including at least two silicon thin film containing silicon as a main component can be obtained. In the case of using the mulit-layered silicon thin film as the negative active material layer of a lithium ion secondary battery, cycle characteristics are not degraded even when an entire thickness of the negative active material layer is increased. Thus, an energy device, which satisfies both an increase in a battery capacity and cycle characteristics, can be provided.

Embodiment 2

An energy device according to Embodiment 2 of the present invention will be described.

Figure 8:
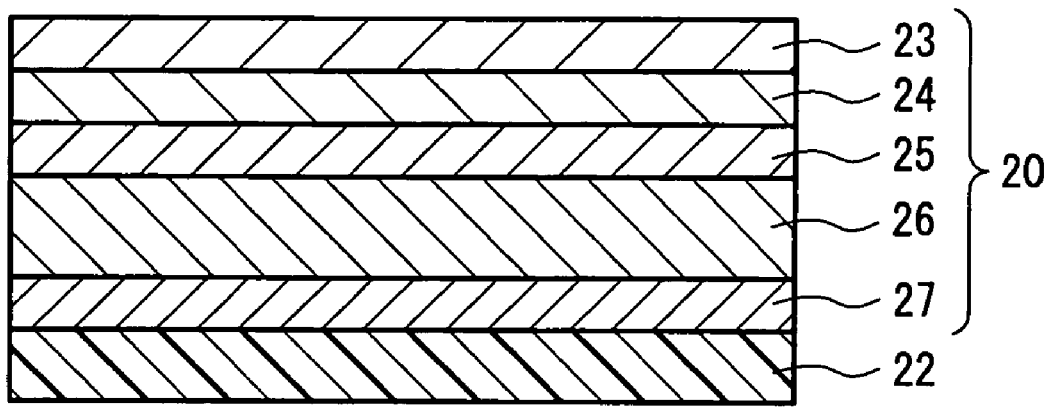
FIG. 8 is a schematic cross-sectional view showing an exemplary configuration of main portions of an energy device according to Embodiment 2 of the present invention.

FIG. 8 shows an exemplary schematic configuration of the energy device according to Embodiment 2 of the present invention. The energy device of the present embodiment has a configuration in which a battery element 20 is laminated on a substrate 22. In the battery element 20, a positive collector 27, a positive active material 26, a solid electrolyte 25 as a layer that does not exhibit electronic conduction, a negative active material 24, and a negative collector 23 are formed in this order. In FIG. 8, although the substrate 22 is placed on the side of the positive collector 27 of the battery element 20, it may be placed on the side of the negative collector 23.

As the substrate 22, a flexible material, such as polyimide (PI), polyamide (PA), polyethylene naphthalate (PEN), polyethylene terephthalate (PET), or other polymer films; a stainless metal foil; a metal foil containing nickel, copper, aluminum, or other metal elements; or the like, can be used. Furthermore, silicon, glass, ceramic, plastic, or the like in various kinds of shapes also can be used, and according to the present invention, there is no particular limit to the material and shape of the substrate. The material and shape of the substrate only need to be selected appropriately in accordance with the characteristics required of the energy device.

As the positive collector 27, for example, metal such as nickel, copper, aluminum, platinum, platinum-palladium, gold, silver, titanium, or ITO (indium-tin oxide) can be used. Depending upon the final form of the energy device, in the case of placing the substrate 22 on the positive electrode side, and using a conductive material as the substrate 22, the substrate 22 is allowed to function as the positive collector 27, with the positive collector 27 being omitted.

As the positive active material 26, for example, lithium cobaltate, lithium nickelate, or the like can be used. The material for the positive active material 26 of the present invention is not limited to the above, and other materials also can be used.

As the solid electrolyte 25, a material having ion conductivity and negligibly small electron conductivity can be used. Particularly, in the case where the energy device is a lithium ion secondary battery, since lithium ions are mobile ions, a solid electrolyte made of $Li_3PO_4$, a material (LiPON: a typical composition is $Li_{2.9}PO_{3.3}N_{0.36}$) obtained by mixing $Li_3PO_4$ with nitrogen (or replacing a part of an element of $Li_3PO_4$ with nitrogen), or the like is preferable due to excellent lithium ion conductivity. Similarly, a solid electrolyte made of a sulfide such as $Li_2S$—$SiS_2$, $Li_2S$—$P_2S_5$, $Li_2S$—$B_2S_3$, or the like also is effective. Furthermore, a solid electrolyte, which is obtained by doping the above-mentioned solid electrolyte with lithium halide such as LiI, or a lithium oxyacid salt such as $Li_3PO_4$, also is effective. The material for the solid electrolyte 25 of the present invention is not limited to the above, and other materials also can be used for the solid electrolyte 25. By using a solid electrolyte as an electrolyte, measures against leakage of liquid, which are necessary in a conventional liquid electrolyte, are not required, facilitating the miniaturization and reduction in thickness of an energy device.

As the negative active material 24, a silicon thin film with a multi-layered configuration including at least two silicon thin films, containing silicon as a main component, can be used.

As the negative collector 23, in the same way as in the positive collector 27, for example, metal such as nickel, copper, aluminum, platinum, platinum-palladium, gold, silver, or ITO (indium-tin oxide) can be used. Depending upon the final form of the energy device, in the case of placing the substrate 22 on the negative electrode side, and using a conductive material as the substrate 22, the substrate 22 can be allowed to function as the negative collector 23, with the negative collector 23 being omitted.

Figure 9:
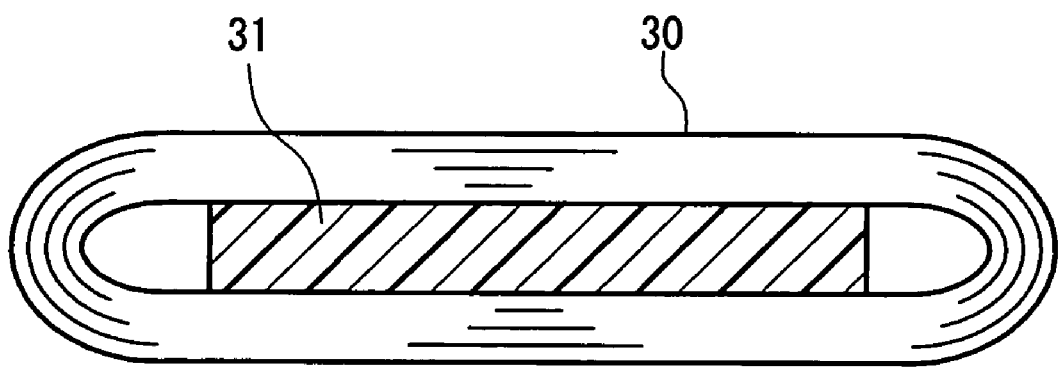
FIG. 9 is a schematic cross-sectional view showing an exemplary product form of the energy device according to Embodiment 2 of the present invention.

There is no particular limit to the product form of the energy device, and various kinds can be considered. For example, a laminate in which the battery element 20 shown in FIG. 8 is laminated on the flexible long substrate 22 may be wound in a plate shape as shown in FIG. 9. In this case, an inner core 31 in a plate shape may be placed on an inner circumference of the winding body 30.

Figure 10:
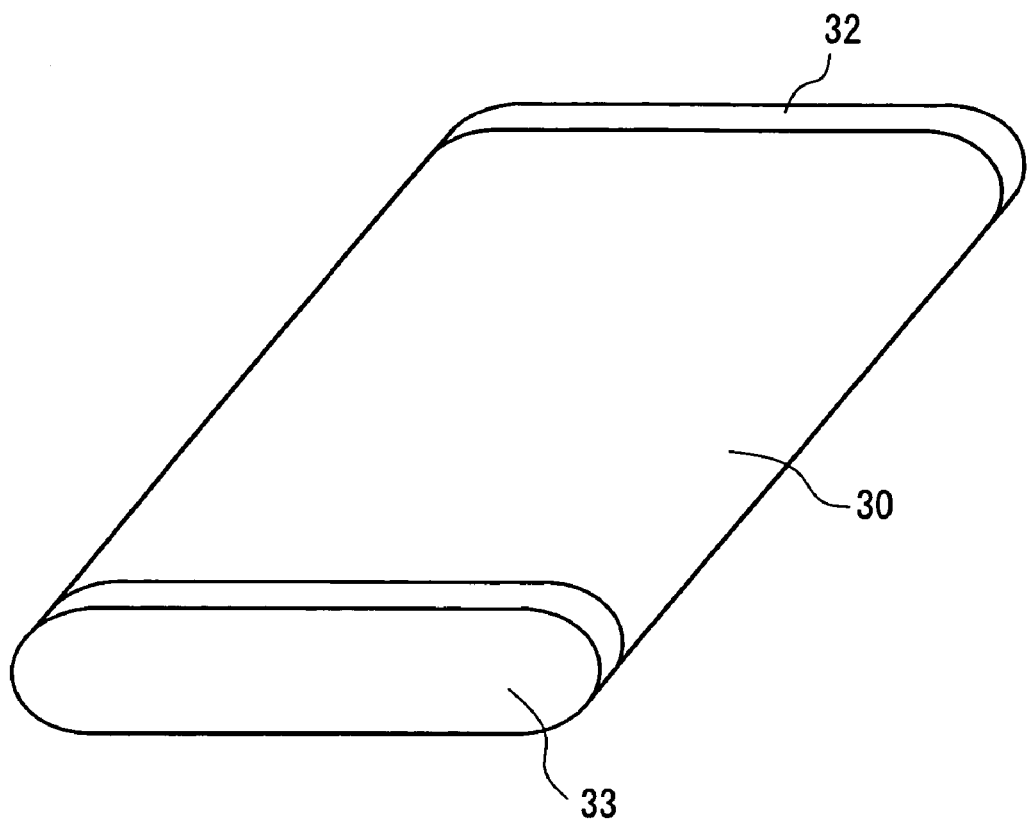
FIG. 10 is a schematic perspective view of the product form of the energy device shown in FIG. 9.

FIG. 10 is a perspective view of the plate-shaped energy device shown in FIG. 9. In FIG. 10, reference numerals 32 and 33 denote a pair of outer electrodes provided on both ends of the winding body 30. The outer electrodes 32-33 can be made of various kinds of conductive materials such as nickel, zinc, tin, a solder alloy, a conductive resin, or the like. As the method for forming the outer electrodes 32-33, thermal spraying, plating, coating, or the like can be used. The negative collector 23 is electrically connected to one outer electrode 32, and the positive collector 27 is electrically connected to the other outer electrode 33. In this case, it is necessary that a region in a width direction (in a direction of a winding center) for forming the negative collector 23 and the positive collector 27 is patterned so that a pair of outer electrodes 32-33 are insulated from each other.

Figure 11:
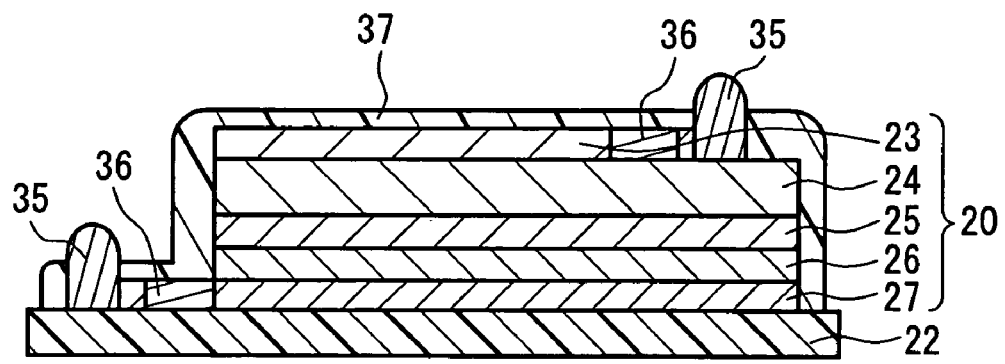
FIG. 11 is a schematic cross-sectional view showing another exemplary product form of the energy device according to Embodiment 2 of the present invention.

FIG. 11 is a cross-sectional view showing another product form of the energy device. In FIG. 11, reference numeral 35 denotes a pair of outer electrodes. The negative collector 23 is electrically connected to one outer electrode 35, and the positive collector 27 is electrically connected to the other outer electrode 35. The material and method for forming the outer electrode 35 are similar to those of the outer electrode 32 shown in FIG. 10.

Reference numeral 36 denotes fuse portions provided in the negative collector 23 at the vicinity of a connected portion to the outer electrode 35, and in the positive collector 27 at the vicinity of a connected portion to the outer electrode 35. The fuse portion 36 functions as a safety apparatus for causing a fuse blowout, when an overcurrent flows, to shut off the overcurrent, thereby avoiding ignition. In the present embodiment, although the fuse portions 36 are provided in the negative collector 23 and the positive collector 27, the fuse portion 36 may be provided in either one of them.

Figure 12A:
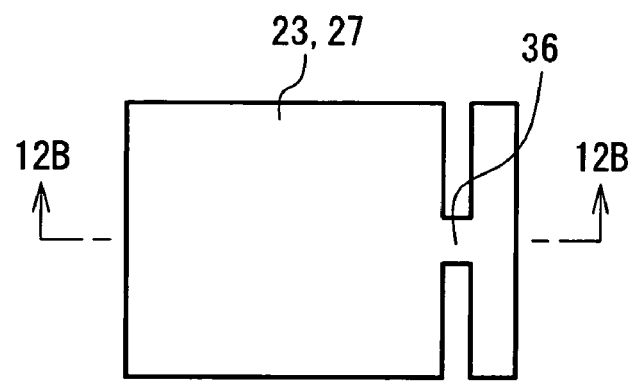
FIG. 12A is a plan view showing an example of a fuse portion in the energy device of the present invention.
Figure 12B:
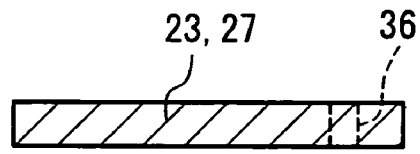
FIG. 12B is a cross-sectional view seen in an arrow direction taken along a line 12B-12B in FIG. 12A.

FIG. 12A is a plan view showing an example of the fuse portion 36. FIG. 12B is a cross-sectional view seen in an arrow direction taken along a line 12B-12B in FIG. 12A. The collectors 23 and 27 are respectively provided with a pattern so that the width of a portion through which a current flows is narrow, whereby the fuse portions 36 are formed. When an overcurrent flows, the fuse portions 36 generate heat due to Joule's heat, causing a fuse blowout, thereby shutting off the overcurrent. Thus, a serious situation such as ignition can be avoided. The configuration of the fuse portion 36 is not limited to that shown in FIGS. 12A and 12B. For example, the fuse portions 36 may be configured by partially reducing the thickness of the negative collector 23 and the positive collector 27. Alternatively, the fuse portions 36 may be formed by forming a different kind of material having a large temperature coefficient of electric resistance in a particular pattern, respectively, in the negative collector 23 and the positive collector 27. The temperature coefficient of electric resistance of the different kind of material is larger than those of the negative collector 23 and the positive collector 27. Therefore, when the temperature of the fuse portions 36 is increased slightly at a time of an overcurrent, the resistance of the different kind of material is increased rapidly. Thus, a current flows concentratedly in the materials for the negative collector 23 and the positive collector 27 other than the different kind of material in the fuse portions 36, and consequently, the fuse portions 36 generate heat due to Joule's heat, causing a fuse blowout, thereby shutting off an overcurrent.

In FIG. 11, reference numeral 37 denotes a protective layer provided for the purpose of mechanical protection, enhancement of moisture resistance, prevention of interlayer peeling, and the like. Examples of the material for the protective layer 37 include, but are not limited to, a surface treatment agent such as silane coupling agent, light-curable or thermosetting resin, metal, a metal oxide, a metal nitride, and the like. As the method for forming the protective layer 37, a wet process such as coating, dipping (soaking), spraying, etc.; or a dry process such as vapor deposition, sputtering, etc. can be adopted. Furthermore, the protective layer 37 may be composed of a multi-layered composite film made of different kinds of materials or the same kind of material. The protective layer 37 can be formed on an outer surface of the energy device excluding the outer electrodes 35. Depending upon the material for the substrate 22, the protective layer 37 may not be formed on the surface of the substrate 22 as shown in FIG. 11.

Furthermore, the energy device may be configured by laminating a required number of the battery elements 20 repeatedly.

Examples 6 and 7, and Comparative Example 3

Examples corresponding to Embodiment 2 will be described.

Nickel (thickness: 0.5 μm) as the positive collector 27, and lithium cobaltate (thickness: 8 μm) as the positive active material 26 were laminated on a polyimide film (thickness: 25 μm) as the substrate 22, respectively by vacuum vapor deposition, and furthermore, the lithium phosphate-based solid electrolyte 25 (thickness: 2 μm) was laminated on the positive active material 26 by vacuum vapor deposition.

Thereafter, a silicon thin film (thickness: 5 μm) was formed as the negative active material 24 on the surface of the solid electrolyte 25. This will be described in detail later.

Then, nickel (thickness: 0.5 μm) as the negative collector 23 was formed on the surface of the negative active material 24, whereby a band-shaped laminate having a laminated configuration shown in FIG. 8 was obtained.

The laminate thus obtained was wound in a plate shape, and a pair of outer electrodes 32-33 were formed so as to be electrically connected to the positive collector 27 and the negative collector 23, respectively, whereby a plate-shaped lithium ion secondary battery as shown in FIG. 10 was obtained.

A method for forming a silicon thin film as the negative active material 24 will be described with reference to FIG. 13.

Figure 13:
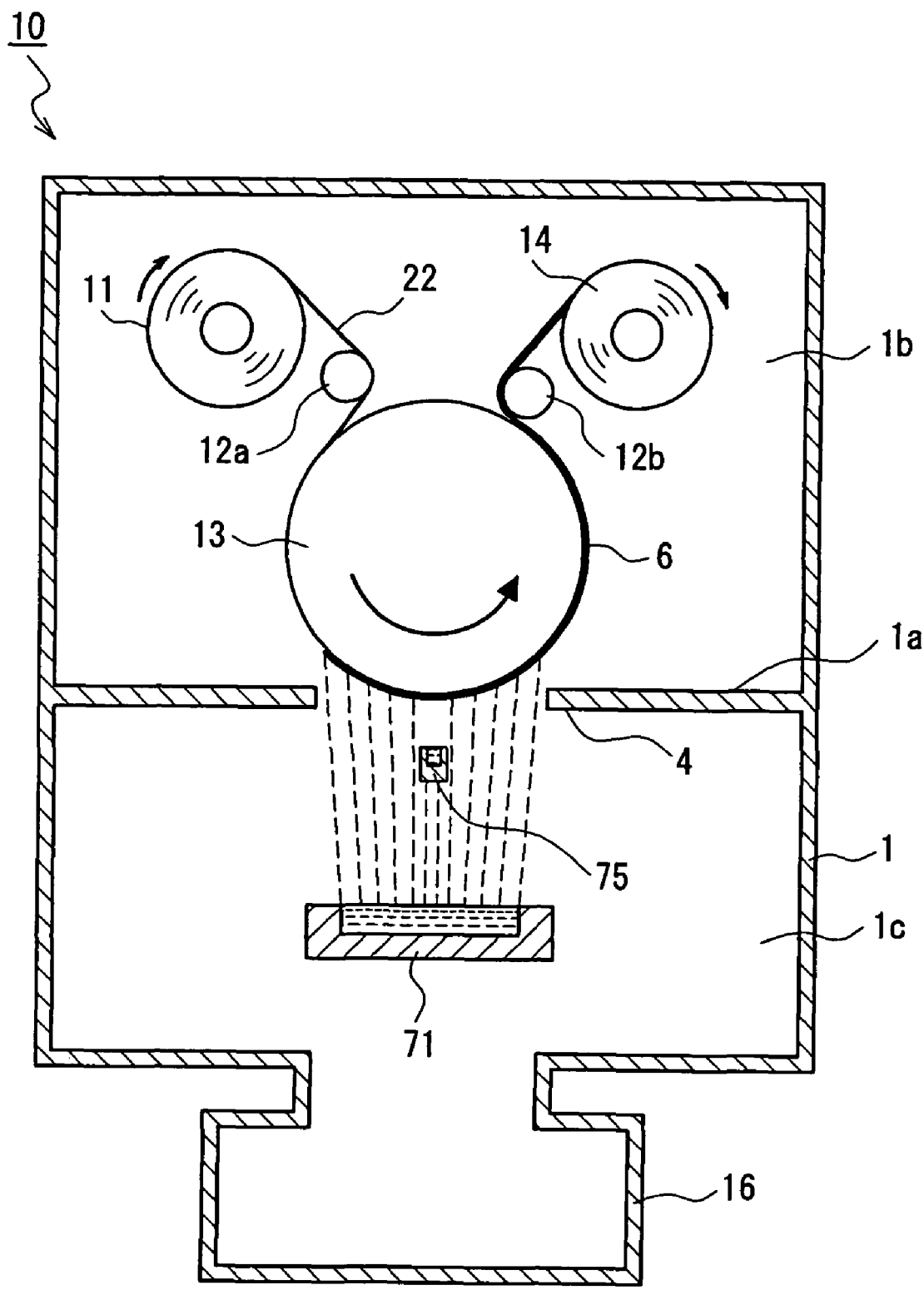
FIG. 13 is a cross-sectional view showing a schematic configuration of still another embodiment of an apparatus used for producing the energy device of the present invention.

An apparatus shown in FIG. 13 is different from that shown in FIG. 1, in that a vapor-deposition source 71 and an intermediate layer vapor-deposition source 75 are placed in the thin film forming chamber 1c, in place of the first sputtering film-forming source 52, the gas introduction nozzle 55, and the second sputtering film-forming source 52. In FIG. 13, the same components as those in FIG. 1 are denoted with the same reference numerals as those therein, and the description thereof will be omitted.

The band-shaped substrate 22 with the positive collector 27, the positive active material 26, and the solid electrolyte 25 formed thereon is unwound from the unwinding roll 11, transported successively by the transportation roll 12a, the can roll 13, and the transportation roll 12b, and taken up around the take-up roll 14. During this process, particles (hereinafter, referred to as "evaporated particles") such as atoms, molecules, or a cluster generated from the vapor-deposition source 71 and the intermediate layer vapor-deposition source 75 pass through the mask 4 of the partition wall 1a, and adhere to the surface of the solid electrolyte 25 of the substrate 22 running on the can roll 13, thereby forming the thin film 6. The vapor-deposition source 71 and the intermediate layer vapor-deposition source 75 are placed so as to oppose the substrate 22. The intermediate layer vapor-deposition source 75 is placed substantially at a center position in a running direction of the substrate 22, in a stream of evaporated particles emitted from the vapor-deposition source 71 and passing through the mask 4. The intermediate layer vapor-deposition source 75 extends across the entire width in a width direction (in a direction vertical to the drawing surface of FIG. 13) of the substrate 22 in the vicinity of the can roll 13. Thus, the intermediate layer vapor-deposition source 75 functions as a second mask, and prevents the evaporated particles from the vapor-deposition source 71 from being deposited on a region of an outer surface of the can roll 13, opposed to the intermediate layer vapor-deposition source 75. Thus, first, the evaporated particles from the vapor-deposition source 71 mainly are deposited on the surface of the solid electrolyte 25 of the substrate 22; then, the evaporated particles from the intermediate layer vapor-deposition source 75 mainly are deposited thereon, and the evaporated particles from the vapor-deposition source 71 mainly are deposited thereon again.

In Examples 6 and 7, using the above-mentioned apparatus, silicon was evaporated from the vapor-deposition source 71 and a copper-aluminum based material (melting point Tm=548° C.) was evaporated from the intermediate layer vapor-deposition source 75 respectively by vacuum vapor deposition, whereby the negative active material 24 (total thickness: 5 μm) with a multi-layered configuration was formed.

Furthermore, in Example 6, the outer circumferential surface temperature of the can roll 13 during formation of the negative active material 24 was maintained at 20° C. by allowing a thermal storage medium (not shown) to circulate inside the can roll 13.

Furthermore, Example 7 was the same as Example 6, except that the outer circumferential surface temperature of the can roll 13 was maintained at 280° C. during formation of the negative active material 24.

Comparative Example 3 was the same as Example 6, except that only the vapor-deposition source 71 was used, with the intermediate layer vapor-deposition source 75 being removed, the outer circumferential surface temperature of the can roll 13 was maintained at 20° C. during formation of the negative active material 24, and the negative active material 24 (thickness: 5 μm) with a single-layered configuration was formed.

Figure 14A:
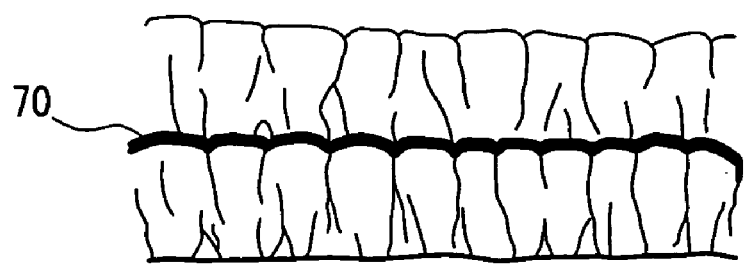
FIGS. 14A and 14B schematically show SEM photographs of cross-sections of the negative active material thin films in Examples 6 and 7 in this order.
Figure 14B:
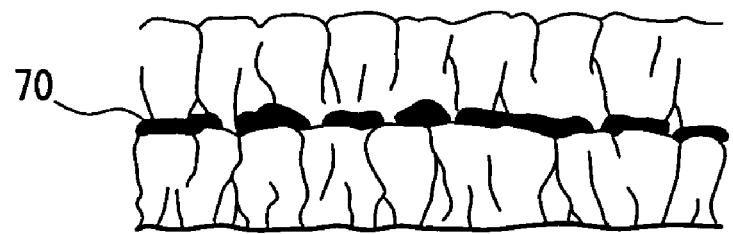

FIGS. 14A and 14B schematically show SEM photographs of cross-sections in a thickness direction of the negative active materials (silicon thin films) 24 in Examples 6 and 7. In each figure, the lower side of the drawing surface corresponds to the solid electrolyte 25 side, and the upper side thereof corresponds to the surface of the negative active material 24.

In Examples 6 and 7 (shown in FIGS. 14A and 14B in this order), silicon particles grow as columnar particles substantially in an inverse truncated cone shape with the particle diameter being increased gradually from an interface between the silicon thin film and the solid electrolyte 25; however, the growth of silicon particles is discontinuous on both sides of a layer (intermediate layer) 70 having a slight thickness present in a central portion in a thickness direction. The negative active material 24 is divided by the intermediate layer 70, and has a two-layered configuration in a vertical direction. The intermediate layer 70 is a copper-aluminum based thin film formed by the intermediate layer vapor deposition source 75. The silicon particles in a layer on an upper side of the intermediate layer 70 newly start growing substantially in an inverse truncated cone shape from the intermediate layer 70, so that an increase in particle diameter in the vicinity of the surface of the negative active material (silicon thin film) 24 is suppressed.

Furthermore, the following was found. In the negative active material 24 (Example 6, FIG. 14A) formed with the outer circumferential surface temperature of the can roll 13 being set to be 20° C., the intermediate layer 70 was a continuous film; however, in the negative active material 24 (Example 7, FIG. 14B) formed with the outer circumferential surface temperature of the can roll 13 being set to be 280° C., the intermediate layer 70 was not a continuous film, and was divided in a net shape or an island shape. The reason for this is considered as follows: the melting point of the copper-aluminum based material is lower than that of silicon; therefore, when the copper-aluminum based material is formed to be a thin film at a high temperature, it is likely to be divided in a net shape or an island shape. The division of the intermediate layer 70 recognized by the comparison between Examples 6 and 7 was confirmed not only in the case where the intermediate layer 70 was made of a copper-aluminum based material, but also in the case where the intermediate layer 70 was made of another material having a low melting point.

Furthermore, after the negative active material 24 was formed under the same condition as that in Example 6, it was heated to 280° C., followed by cooling, and a SEM photograph of a cross-section in a thickness direction was taken. Consequently, the resultant intermediate layer was divided in a net shape or an island shape in the same way as the intermediate layer 70 in Example 7 (FIG. 14B). That is, it was confirmed that, even when the continuous intermediate film made of a material with a low melting point is formed, followed by heating, an intermediate layer divided in a net shape or an island shape is obtained.

Although not shown, in Comparative Example 3 using no intermediate layer vapor-deposition source 75, in the same way as in Comparative Example 2 (FIG. 6A), silicon particles grew as columnar particles substantially in an inverse truncated cone shape with the particle diameter being increased gradually from an interface between the silicon thin film and the solid electrolyte 25, and the particle diameter was largest in the vicinity of the surface of the negative active material 24.

The lithium ion secondary batteries obtained in Examples 6 and 7 and Comparative Example 3 were subjected to a charging/discharging cycle test at a test temperature of 20° C., a charging/discharging current of 3 mA/cm$^2$, and a charging/discharging voltage range of 4.2 V to 2.5 V. The ratios of the discharging capacity after 50 cycles and 200 cycles, with respect to the initial discharging capacity, were obtained as battery capacity maintenance ratios (cycle characteristics). Table 3 shows the results.

TABLE 3

|  | Example 6 | Example 7 | Comparative Example 3 |
|---|---|---|---|
| After 50 cycles | 82% | 79% | 54% |
| After 200 cycles | 67% | 65% | 26% |

As is understood from Table 3, in Examples 6 and 7 in which the growth of silicon particles is discontinuous on an intermediate layer substantially at a center in a thickness direction, the battery capacity maintenance ratios after 50 cycles and 200 cycles are higher than those in Comparative Example 3 in which the intermediate layer is not present, and the growth of silicon particles is continuous in an entire range in a thickness direction.

In Table 3, a conspicuous difference in cycle characteristics is not recognized between Example 6 in which the intermediate layer is a continuous film and Example 7 in which the intermediate layer is a divided film.

The capacity maintenance ratio after 50 cycles in the case where charging/discharging was performed at a high charging/discharging rate of 5C was 58% in Example 6, and 65% in Example 7. Thus, an excellent result was obtained in Example 7. The reason for this may be considered as follows: the intermediate layer is divided in a net shape or an island shape, whereby ions are able to move more easily in the negative active material 24.

In the present example, the negative active material 24 with a two-layered configuration is formed using one vapor-deposition source 71. However, the negative active material 24 with a two-layered configuration may be formed using two vapor-deposition sources as shown in FIG. 5.

In Embodiments 1 and 2, the negative active material thin film (silicon thin film) is provided directly on the surface of the collector layer. However, the present invention is not limited thereto, and the negative active material thin film may be provided via an underlying layer formed on the surface of the collector layer. The underlying layer may be formed for the purpose of enhancement of adhesion between the collector layer and the negative active material thin film (silicon thin film), a rust-proofing treatment, and the like. Specifically, a silicon-copper thin film, a chromate-treated layer, or the like, for example, can be used. Alternatively, a layer formed by a surface treatment (described later) may be used.

Furthermore, in the above-mentioned Embodiments 1 and 2, the negative active material thin film (silicon thin film) is formed by sputtering or vapor deposition. However, the present invention is not limited thereto. Other vacuum film-forming methods such as CVD may be used, and even in this case, the similar effects can be obtained.

Furthermore, the negative active material thin film described in the above examples has a two-layered configuration composed of two silicon thin films. However, the present invention is not limited thereto. A multi-layered configuration of three or more layers may be used. Due to the multi-layered configuration, the enhancement of cycle characteristics that is the effect of the present invention can be achieved. The thickness of one silicon thin film is preferably 12 μm or less, more preferably 6 μm or less, and most preferably 2 μm or less. When the thickness of one silicon thin film exceeds 12 μm, the particle diameter of the columnar particles is increased in the silicon thin film, whereby a decrease in cycle characteristics becomes conspicuous. Thus, in the case where the thickness of one silicon thin film exceeds 12 μm, although cycle characteristics are enhanced by allowing a negative active material thin film to have a multi-layered configuration, compared with the case where the negative active material thin film is not divided into multiple layers, there still remains a problem in terms of a practical use for a long period of time. The number of the negative active material thin films can be set in accordance with the thickness of the negative active material thin film to be formed.

The typical diameter of silicon particles obtained in the above example is about 2 to 15 μm before expansion due to lithium absorption, and generally, each silicon particle is composed of a combination of a plurality of silicon fine particles with a diameter of 1 to 6 μm. It should be noted that the silicon particle diameter in the present invention is not limited thereto.

The copper foil used as the negative collector in Examples 1 to 5 may be subjected to surface treatment. As the surface treatment that can be used for the copper foil, zinc plating; alloy plating of zinc and tin, copper, nickel or cobalt; formation of a covering layer, using an azole derivative such as benzotriazole; formation of a chromium-containing coating film, using a solution containing chromic acid or dichromate; or a combination thereof can be used. Alternatively, in place of a copper foil, another substrate provided with a copper covering may be used. The above-mentioned surface treatment may be performed with respect to the surface of the copper covering.

Although not mentioned in the description of the above-mentioned embodiments and examples, it is desirable that a silicon thin film is formed in an atmosphere of inert gas or nitrogen. An atmospheric gas may be introduced toward a film-formation surface (the opening of the mask 4 in the above-mentioned examples). Alternatively, the atmospheric gas may be introduced so as to spread through an entire vacuum tank (the thin film forming chamber 1c in the above-mentioned examples). In terms of efficiency, it is preferable that the atmospheric gas is introduced toward the film-formation surface.

By forming a silicon thin film in such an atmospheric gas, silicon columnar particles adjacent to each other in a direction parallel to the film-formation surface can be prevented from being integrated and growing to enlarge the particle diameter of silicon. Consequently, the degradation of the cycle characteristics due to the extreme expansion/contraction of silicon particles during charging/discharging can be suppressed. According to the experiment by the inventors of the present invention, although a graph showing detailed experimental results is omitted, by forming a silicon thin film in the above-mentioned gas atmosphere, the number of charging/discharging cycles for decreasing the battery capacity maintenance ratio of the energy device to 80% was increased, for example, by 15 to 50%.

The preferable introduction amount of gas is set in accordance with the film-formation condition of the silicon thin film, particularly, in accordance with the thin film deposition rate R (nm/s). For example, in the case of introducing gas toward the film-formation surface, a gas introduction amount Q (m$^3$/s) per film-formation width of 100 mm is preferably in a range of $1\times10^{-10}\times R$ to $1\times10^{-6}\times R$, and more preferably in a range of $1\times10^{-9}\times R$ to $1\times10^{-7}\times R$. When the gas introduction amount is too small, the above-mentioned effects cannot be obtained. In contrast, when the gas introduction amount is too large, the deposition rate of the silicon thin film is decreased.

As the gas to be used, argon is most preferable in terms of practicality and conspicuousness of the above-mentioned effects.

Furthermore, it may be preferable that a part of silicon contained in the silicon thin film is an oxide. In the case where the content of silicon in the silicon thin film is large, and the battery capacity is large, the degree of expansion/contraction of the silicon thin film during charging/discharging may be increased, and cycle characteristics may be degraded. When the silicon thin film contains an oxide of silicon, since the oxide of silicon expands/contracts less during charging/discharging, the expansion/contraction of the silicon thin film during charging/discharging can be suppressed, and cycle characteristics can be enhanced. For example, it is preferable that the silicon thin film is formed so that 20 to 50% of silicon contained in the silicon thin film becomes an oxide. According to the experiment by the inventors of the present invention, although a graph showing detailed experimental results is omitted, by allowing the silicon thin film to contain an oxide of silicon, the number of charging/discharging cycles for decreasing the battery capacity maintenance ratio of the energy device to 80% was increased, for example, by 10 to 140% (which depends upon the silicon thin film).

A part of silicon can be formed into an oxide, for example, by introducing oxygen-based gas in the vicinity of the film-formation surface, and allowing the gas to react with silicon atoms, during formation of the silicon thin film in a vacuum atmosphere. In order to enhance reactivity, it is effective to use ozone, and provide energy by plasma, a substrate potential, or the like.

The preferable introduction amount of gas is set in accordance with the film-formation condition of the silicon thin film, particularly, in accordance with the thin film deposition rate R (nm/s). For example, in the case where gas is introduced toward a film-formation surface, a gas introduction amount P(m$^3$/s) per film-formation width of 100 mm is preferably in a range of $1\times10^{-11}\times R$ to $1\times10^{-5}\times R$, more preferably in a range of $1\times10^{-10}\times R$ to $1\times10^{-6}\times R$, and most preferably in a range of $1\times10^{-9}\times R$ to $1\times10^{-7}\times R$. It should be noted that the gas introduction amount P is not limited to the above, depending upon the facility form and the like. When the gas introduction amount is too small, the above-mentioned effects cannot be obtained. In contrast, when the gas introduction amount is too large, the entire silicon thin film becomes an oxide, which decreases a battery capacity.

The applicable field of the energy device of the present invention is not particularly limited. For example, the energy device can be used as a secondary battery for thin and light-weight portable equipment of a small size.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An energy device comprising a collector layer and a negative active material thin film provided on the collector layer directly or via an underlying layer,
   wherein the negative active material thin film has a multi-layered configuration including at least two silicon thin films adjacent to each other and an interface between adjacent silicon thin films, each silicon thin film containing silicon as a main component and further containing oxygen and
   an oxygen distribution in a thickness direction of the negative active material thin film shows a peak in a neighborhood of the interface.

2. The energy device according to claim 1, wherein the silicon thin film has columnar particles with a thickness direction being a longitudinal direction, and
   the columnar particles are discontinuous between the silicon thin films adjacent to each other.

3. The energy device according to claim 1, wherein the negative active material thin film further includes an intermediate layer containing silicon and oxygen between the silicon thin films adjacent to each,
   and an oxygen concentration of the intermediate layer is higher than an oxygen concentration of the silicon thin films.

4. The energy device of claim 1, wherein the silicon content is at least 70 atomic %.

* * * * *